US012787862B2

(12) United States Patent
Seok et al.

(10) Patent No.: US 12,787,862 B2
(45) Date of Patent: Nov. 3, 2026

(54) ZIGZAG WIRED MEMORY MODULE

(71) Applicant: SAMSUNG ELECTRONICS CO., LTD., Suwon-si (KR)

(72) Inventors: Jonghyun Seok, Seoul (KR); Kyeongseon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1054 days.

(21) Appl. No.: 17/852,556

(22) Filed: Jun. 29, 2022

(65) Prior Publication Data

US 2023/0061451 A1 Mar. 2, 2023

(30) Foreign Application Priority Data

Aug. 30, 2021 (KR) ........................ 10-2021-0115026
Nov. 11, 2021 (KR) ........................ 10-2021-0155157

(51) Int. Cl.

| | |
|---|---|
| ***G11C 5/06*** | (2006.01) |
| ***H05K 1/181*** | (2026.01) |
| ***H05K 3/341*** | (2026.01) |
| ***H10W 90/00*** | (2026.01) |
| *G11C 5/04* | (2006.01) |

(52) U.S. Cl.

CPC ............... *H10W 90/00* (2026.01); *G11C 5/06* (2013.01); *H05K 1/181* (2013.01); *H05K 3/341* (2013.01); *G11C 5/04* (2013.01); *H05K 2201/09409* (2013.01); *H05K 2203/041* (2013.01)

(58) Field of Classification Search

CPC ...................................................... H05K 1/181

See application file for complete search history.

(56) References Cited

U.S. PATENT DOCUMENTS

| | | | | |
|---|---|---|---|---|
| 6,594,167 | B1 | 7/2003 | Yamasaki et al. | |
| 7,161,820 | B2 | 1/2007 | Funaba et al. | |
| 7,315,454 | B2 | 1/2008 | Schuster | |
| 7,972,902 | B2 | 7/2011 | Youn et al. | |
| 9,343,419 | B2 * | 5/2016 | Yu | H01L 24/17 |
| 9,449,650 | B2 | 9/2016 | Seok et al. | |
| 9,704,559 | B2 * | 7/2017 | Hayashi | G11C 7/10 |
| 9,786,354 | B2 | 10/2017 | Seok et al. | |
| 9,811,265 | B2 * | 11/2017 | Park | G06F 3/061 |

(Continued)

FOREIGN PATENT DOCUMENTS

| | | |
|---|---|---|
| JP | 10-322078 | 12/1998 |
| JP | 2002-026248 | 1/2002 |

(Continued)

*Primary Examiner* — Douglas King

(74) *Attorney, Agent, or Firm* — Morgan, Lewis & Bockius LLP

(57) ABSTRACT

A memory module includes a printed circuit board (PCB) including a multi-layer having a wiring structure formed therein. A length of the PCB in a first direction is longer than a length of the PCB in a second direction perpendicular to the first direction. A plurality of memory chips includes a plurality of solder balls. The plurality of memory chips is arranged in a first row and a second row respectively extending in the first direction on the PCB. The plurality of solder balls is continuously arranged in the first direction. The wiring structure alternately zigzag-connects the plurality of memory chips arranged in the first row and the second row.

20 Claims, 12 Drawing Sheets

(56) References Cited

U.S. PATENT DOCUMENTS

| | | | | |
|---|---|---|---|---|
| 10,831,963 | B1 | 11/2020 | Chen | |
| 2003/0222282 | A1* | 12/2003 | Fjelstad | H01L 23/49805 257/200 |
| 2004/0071040 | A1* | 4/2004 | Funaba | G11C 5/063 365/232 |
| 2006/0180917 | A1* | 8/2006 | Djordjevic | H05K 1/115 257/691 |
| 2008/0099238 | A1* | 5/2008 | Djordjevic | H05K 1/0237 174/262 |
| 2008/0123303 | A1* | 5/2008 | Sugano | G11C 5/00 361/728 |
| 2010/0187690 | A1* | 7/2010 | Okada | H01L 24/85 257/738 |
| 2010/0307798 | A1* | 12/2010 | Izadian | H01L 25/50 174/255 |
| 2010/0309706 | A1* | 12/2010 | Saito | G11C 7/1078 365/191 |
| 2012/0250264 | A1 | 10/2012 | Osanai et al. | |
| 2016/0267954 | A1* | 9/2016 | Sun | G11C 5/04 |
| 2017/0046066 | A1* | 2/2017 | Park | G06F 3/061 |
| 2020/0083623 | A1* | 3/2020 | Huang | H05K 1/111 |
| 2020/0084881 | A1* | 3/2020 | Lee | H05K 1/0228 |
| 2021/0151408 | A1* | 5/2021 | Yu | H01L 24/08 |
| 2022/0272880 | A1* | 8/2022 | Chauhan | H01L 23/32 |
| 2023/0124783 | A1* | 4/2023 | Kim | H01L 25/105 257/712 |

FOREIGN PATENT DOCUMENTS

| | | |
|---|---|---|
| KR | 10-0235495 | 9/1999 |
| KR | 10-2015-0007188 A | 1/2015 |
| KR | 10-2017-0019288 A | 2/2017 |

* cited by examiner

ZIGZAG WIRED MEMORY MODULE

CROSS-REFERENCE TO RELATED APPLICATIONS

This application claims priority under 35 U.S.C. § 119 to Korean Patent Application No. 10-2021-0115026, filed on Aug. 30, 2021 in the Korean Intellectual Property Office and Korean Patent Application No. 10-2021-0155157, filed on Nov. 11, 2021 in the Korean Intellectual Property Office, the disclosures of which are incorporated by reference in their entireties herein.

1. TECHNICAL FIELD

The present inventive concept relates to a semiconductor module such as a memory module employed in a data processing system, and more particularly, to a zigzag wired memory module.

2. DISCUSSION OF RELATED ART

A semiconductor memory applied to various electronic devices, such as a personal computer (PC), a server computer, and a workstation, or a data processing system such as a communication system is configured in the form of a memory module and is connected to a system board. The memory module may be configured as a dual in-line memory module (DIMM) in which a plurality of memory packages are mounted on a substrate.

Recently, memory modules having a small scale and a high capacity, high integration, and high performance have been developed for application to miniaturized electronic products or data processing systems with high capacity, high integration, and high performance. As the operation speed of the memory generally increases, the topology of signal lines constituting the memory module has been changed to be suitable for a high-speed operation. Recently, a fly-by type connection that constitutes a channel in the form of daisy-chain and is connected to each loading through a short stub has been developed. However, as routing of numerous signals included in the memory module becomes complicated, it has become difficult to control the operating speed of memory devices.

SUMMARY

Embodiments of the present inventive concept provide a zigzag wired memory module.

The technical problems of the present inventive concept are not limited to the technical problems mentioned above, and other technical problems not mentioned will be clearly understood by those skilled in the art from the following description.

According to an embodiment of the present inventive concept, a memory module includes a printed circuit board (PCB) comprising a multi-layer. A length of the PCB in a first direction is longer than a length of the PCB in a second direction perpendicular to the first direction. A first memory chip is mounted on the PCB. A length of the first memory chip in the first direction is longer than a length of the first memory chip in the second direction. A second memory chip is spaced apart from the first memory chip in the second direction. A length of the second memory chip in the first direction is longer than a length of the second memory chip in the second direction. A third memory chip is spaced apart from the first memory chip in the first direction. A length of the third memory chip in the first direction is longer than a length of the third memory chip in the second direction. A fourth memory chip is spaced apart from the second memory chip in the first direction. A length of the fourth memory chip in the first direction is longer than a length of the fourth memory chip in the second direction. A signal line transmits a command/address signal to each of the first to fourth memory chips. The signal line comprises a first wiring formed inside the PCB. The first wiring connects the first memory chip to the second memory chip, and connects the third memory chip to the fourth memory chip.

A second wiring is formed inside the PCB. The second wiring connects the second memory chip to the third memory chip.

According to an embodiment of the present inventive concept, a memory module includes a printed circuit board (PCB) comprising a multi-layer having a wiring structure formed therein. A length of the PCB in a first direction is longer than a length of the PCB in a second direction perpendicular to the first direction. A plurality of memory chips includes a plurality of solder balls. The plurality of memory chips is arranged in a first row and a second row respectively extending in the first direction on the PCB. The plurality of solder balls is arranged continuously in the first direction, and are partially discontinuously arranged in the second direction. A number of the plurality of solder balls arranged in the first direction is greater than a number of the plurality of solder balls arranged in the second direction. The wiring structure alternately zigzag-connects the plurality of memory chips arranged in the first row and the second row inside the PCB.

According to an embodiment of the present inventive concept, a memory system includes a memory module comprising a printed circuit board (PCB). A length of the PCB in a first direction is longer than a length of the PCB in a second direction perpendicular to the first direction. A plurality of memory chips is arranged in a first row and a second row respectively extending in the first direction on the PCB. A length of each memory module in the first direction is longer than a length of each memory module in the second direction. A memory controller transmits a signal to the memory module. The PCB comprises a first wiring connecting the plurality of memory chips arranged in the first row and the second row. The first wiring has a shape of a straight line extending in a third direction. A second wiring is formed in a layer different than a layer that the first wiring is formed. The second wiring connects the plurality of memory chips arranged in the first row and the second row. The second wiring has a shape of a straight line extending in a fourth direction that is a direction different from the third direction. A via electrically connects the first wiring and the second wiring.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
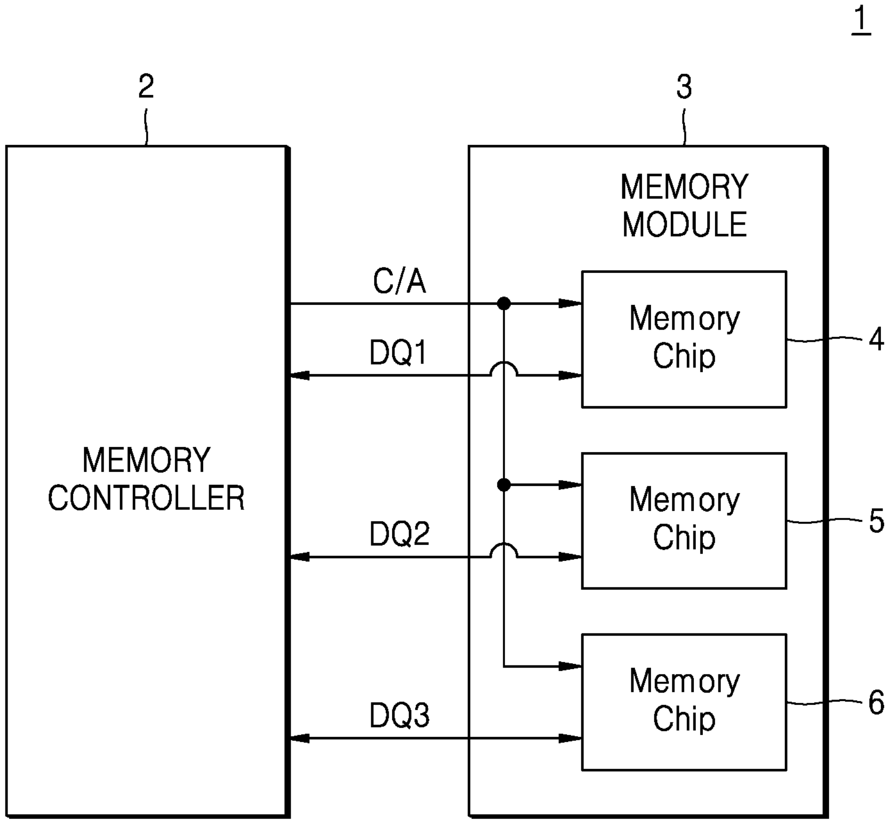
FIG. 1 is a block diagram illustrating a memory system according to an embodiment of the present inventive concept.

Hereinafter, embodiments of the present inventive concept will be described in detail with reference to the accompanying drawings. In the following plan views, a horizontal direction in a plan view is defined as a first direction X, a vertical direction in a plan view is defined as a second direction Y, and a direction substantially perpendicular to the plan view is defined as a third direction Z. Accordingly, the second direction Y may mean a direction perpendicular to the first direction X. A direction indicated by the arrow in the drawing and an opposite direction thereof are described as the same direction. The definitions of the above-mentioned directions are the same in all drawings hereinafter. In the drawings of this specification, only some drawings may be shown for the convenience of illustration. When describing with reference to the drawings, the same or corresponding elements are denoted by the same reference numerals, and redundant descriptions thereof are omitted.

FIG. 1 is a block diagram illustrating a memory system 1 according to an embodiment.

Referring to FIG. 1, the memory system 1 may include a memory controller 2 and a memory module 3.

The memory controller 2 may transmit a command/address signal (C/A, hereinafter referred to as a 'C/A signal') to the memory module 3, and control the memory module 3. The memory controller 2 may exchange data with the memory module 3 according to the C/A signal C/A. For example, the memory controller 2 may exchange data input/output signals (DQ1 to DQ3, hereinafter referred to as 'DQ signals') with the memory module 3.

The memory controller 2 may control the memory module 3 according to a request from a processor supporting various applications such as a server application, a personal computer (PC) application, a mobile application, etc. The memory controller 2 may be included in a host including a processor, and may control the memory module 3 according to a request of the processor.

Transmission paths for the C/A signal C/A and the DQ signals DQ1 to DQ3 may be respectively provided between the memory controller 2 and the memory module 3. For example, in an embodiment, first to third memory chips 4 to 6 may share transmission paths for the C/A signal C/A, but may not share transmission paths for the DQ signals DQ1 to DQ3.

The memory module 3 may include the first to third memory chips 4 to 6. The memory module 3 may represent any device including a plurality of memory chips. For example, the memory module 3 may be a memory package.

The first to third memory chips 4 to 6 may receive the C/A signal C/A from the memory controller 2 and respectively exchange the DQ signals DQ1 to DQ3 with the memory controller 2. For example, the first memory chip 4 may exchange the first DQ signal DQ1 with the memory module 3 in response to the C/A signal C/A. Similarly, the second and third memory chips 5 and 6 may also exchange the second DQ signal DQ2 and the third DQ signal DG3 with the memory module 3, respectively. In the present embodiment, only the first to third memory chips 4 to 6 are illustrated, but the number of memory chips of the memory module 3 is not limited to the illustrated one. For example, in an embodiment, the number of memory chips included in the memory module 3 may be greater than or equal to four.

Wirings transmitting the C/A signal C/A to the first to third memory chips 4 to 6 may be formed inside the memory module 3. In an embodiment, the wirings transmitting the C/A signal C/A to the first to third memory chips 4 to 6 may be implemented by zigzagging first and second wirings in the shape of a straight line. The first to third memory chips 4 to 6 may receive the C/A signal C/A from the memory controller 2 through the zigzagged first and second wirings. Hereinafter, a wiring structure of the first to third memory chips 4 to 6 is described in more detail.

Figure 2:
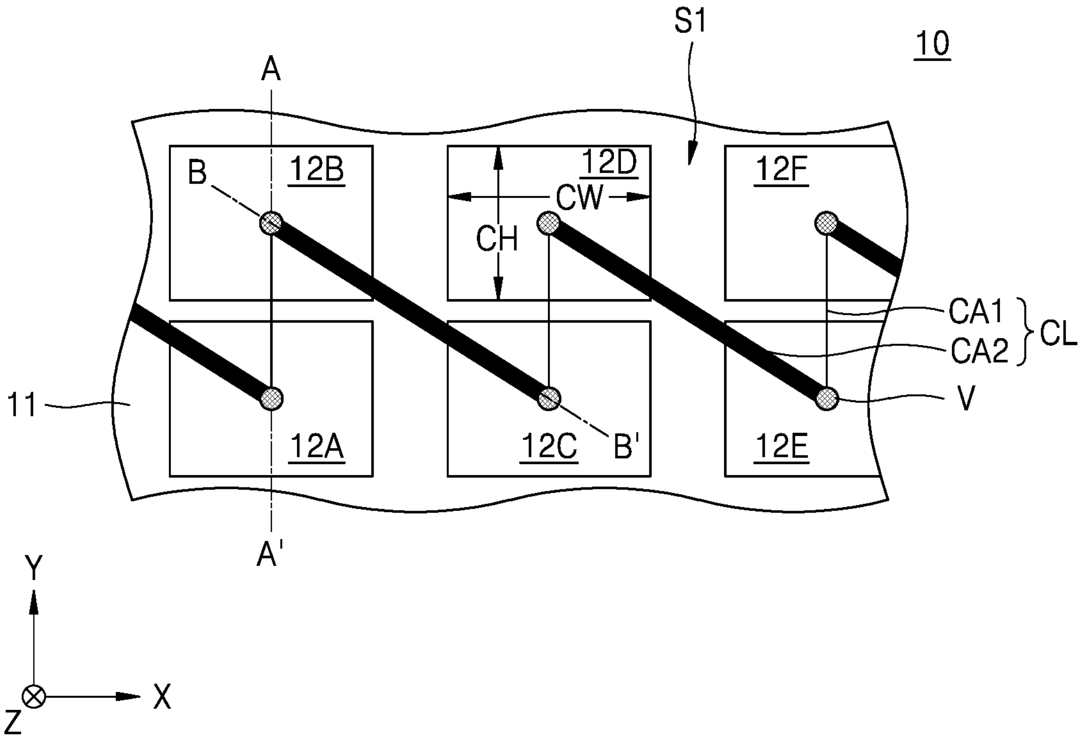
FIG. 2 is a plan view of a memory module according to an embodiment of the present inventive concept.

FIG. 2 is a plan view of a memory module 10 according to an embodiment of the present inventive concept. FIG. 2 is a diagram illustrating an embodiment in which the memory module 3 of FIG. 1 is implemented. Hereinafter, FIG. 2 is described with reference to FIG. 1, and redundant descriptions are omitted for convenience of explanation.

Referring to FIG. 2, the memory module 10 may include a printed circuit board (PCB) 11 and a plurality of memory chips 12A to 12F.

In an embodiment, the memory module 10 may be implemented as a single in-line memory module (SIMM), a dual in-line memory module (DIMM), a small-outline DIMM (SODIMM), an unbuffered DIMM (UDIMM), a fully-buffered DIMM (FBDIMM), a rank-Buffered DIMM (RBDIMM), a mini-DIMM, a micro-DIMM, a registered DIMM (RDIMM), a load-reduced DIMM (LRDIMM), a centaur DIMM (CDIMMs), a differential DIMM (DDIMM), or a compute express link DIMM (CXL DIMM).

The PCB 11 may mean a thin plate on which various electrical components (e.g., a memory chip, a buffer, a resistor, a capacitor, etc.) are mounted. The PCB 11 may be configured such that a copper wiring pattern is formed on one surface or both surfaces of an insulating plate such as an epoxy resin. The PCB 11 may be a rigid PCB, a flexible PCB, or a rigid-flexible PCB.

In an embodiment, the PCB 11 may include at least one compound selected from silicon germanium, silicon carbide, gallium arsenide, indium arsenide, indium phosphide, silicon germanium carbide, gallium arsenide phosphide, gallium indium phosphide, and a combination thereof. The PCB 11 may be a semiconductor-on-insulator (SOI) substrate. The SOI substrate may include a plurality of layers formed of at least one of epitaxial silicon, germanium, silicon germanium, SOI, silicon germanium on insulator (SGOI), or a combination thereof. The PCB 11 may be provided based on an insulating core such as a glass fiber reinforced resin core. For example, the PCB 11 may include a glass fiber resin such as flame retardant 4 (FR4).

A plurality of memory chips 12A to 12F may be mounted on the PCB 11. In an embodiment, the PCB 11 may be formed to have a length in the first direction X that is longer than a length in the second direction Y, and the plurality of memory chips 12A to 12F may have a horizontal length CW, which is the length in the first direction X, longer than a vertical length CH, which is the length in the second direction Y. As will be described below with reference to FIG. 3, each of the plurality of memory chips 12A to 12F may include solder balls electrically connecting the plurality of memory chips 12A to 12F to the PCB 11. The solder balls formed in each of the plurality of memory chips 12A to 12F may be sequentially arranged in the first direction X and may be partially discontinuously arranged in the second direction Y. Also, the number of solder balls formed in each of the plurality of memory chips 12A to 12F arranged in the first direction X may be greater than the number thereof arranged in the second direction Y.

The plurality of memory chips 12A to 12F may be spaced apart from each other in the first direction X and the second direction Y. The plurality of memory chips 12A to 12F may be arranged in at least two rows each extending in the first direction X, and the memory chips (e.g., 12B, 12D, and 12F) arranged in a first row and the memory chips (e.g., 12A, 12C, and 12E) arranged in a second row may be arranged side by side. For example, the plurality of memory chips (e.g., 12A, 12C, and 12E) arranged in the same row may be arranged on the same axis in the first direction X. Among the plurality of memory chips 12A to 12F, the memory chips (e.g., 12A and 12B) adjacent in the second direction Y may be disposed on the same axis in the second direction Y. For example, among the plurality of memory chips 12A to 12F, the memory chips (e.g., 12A and 12B) adjacent in the second direction Y may be aligned in the second direction Y.

In an embodiment of FIG. 2, six memory chips 12A to 12F arranged side by side in the two rows on a first surface S1 of the PCB 11 are illustrated. However, embodiments of the present inventive concept are not necessarily limited thereto. According to an embodiment, the memory chips 12A to 12F may be mounted on the first surface S1 and a second surface opposite to (e.g., in the third direction Z) the first surface S1 of the PCB 11.

Each of the plurality of memory chips 12A to 12F may be a semiconductor memory package. The semiconductor memory package may include at least one semiconductor memory die, and the semiconductor memory die may include a semiconductor substrate, in which an electronic circuit is integrated, cut and processed in the form of a chip. In an embodiment, the semiconductor memory die may be a semiconductor memory die in which a memory integrated circuit such as a dynamic random-access memory (DRAM), static random-access memory (SRAM), FLASH, magnetoresistive random-access memory (MRAM), resistive random-access memory (ReRAM), or ferroelectric random-access memory (FeRAM) is integrated.

The PCB 11 may include a first wiring CA1 and a second wiring CA2. The first wiring CA1 and the second wiring CA2 are formed inside the PCB 11, but are illustrated on the PCB 11 and the plurality of memory chips 12A to 12F for convenience of description.

The first wiring CA1 and the second wiring CA2 may electrically connect the plurality of memory chips 12A to 12F to each other through a landing pad of the PCB 11 and solder balls of the plurality of memory chips 12A to 12F, as will be described below with reference to embodiments of FIGS. 3 to 5. The first wiring CA1 and the second wiring CA2 may transmit the C/A signal received from the memory controller (2 of FIG. 1) to the plurality of memory chips 12A to 12F. For example, the first wiring CA1 and the second wiring CA2 may be included in a C/A signal line CL for transmitting the C/A signal received from the memory controller (2 of FIG. 1) to the plurality of memory chips 12A to 12F.

The C/A signal line CL may alternately zigzag-connect the plurality of memory chips 12A to 12F arranged in the first row and the second row extending in the first direction X. The C/A signal line CL may include the first wiring CA1 and the second wiring CA2 that are alternately and repeatedly disposed. The first wiring CA1 and the second wiring CA2 may be configured in the shape of straight lines extending in different directions.

For example, the first wiring CA1 may be configured in the shape of the straight line extending in the second direction Y, and the second wiring CA2 may be configured in the shape of the straight line extending between the first direction X and the second direction Y. Accordingly, the length of the first wiring CA1 may be shorter than the length of the second wiring CA2. However, embodiments of the present inventive concept are not necessarily limited thereto. For example, in an embodiment, the length of the first wiring CA1 may be the same as the length of the second wiring CA2.

The first wiring CA1 and the second wiring CA2 may be disposed on different layers of the PCB 11, and may be electrically connected to each other through vias V. The via V may be formed to extend in the third direction Z so that the first wiring CA1 and the second wiring CA2 are connected to each other. According to an embodiment, the first wiring CA1 may be disposed in a layer closer to the plurality of memory chips 12A to 12F in the third direction Z than the second wiring CA2. However, embodiments of the present inventive concept are not necessarily limited thereto. For example, in an embodiment, the second wiring CA2 may be disposed in a layer closer to the plurality of memory chips 12A to 12F in the third direction Z than the first wiring CA1.

The memory module 10 according to an embodiment of the present inventive concept may repeatedly zigzag the first wiring CA1 and the second wiring CA2 configured in the shape of the straight line, thereby implementing a simple wiring structure. For example, the first wiring CA1 and the second wiring CA2 may be repeatedly arranged in an alternating manner along the first direction X to zigzag-connect the memory chips to each other in which the first wiring CA1 extends in the second direction Y to connect adjacent memory chips in different rows that are aligned with each other in the second direction Y and the second wiring CA2 extends in a direction between the first direction X and the second direction Y to connect memory chips in different rows that are offset with each other in the second direction Y (e.g., memory chips that are diagonally adjacent to each other). Accordingly, the space efficiency inside the PCB 11 is increased, and a signal path through which the C/A signal must pass is reduced, and thus the signal characteristics may be increased. In addition, the layer inside the PCB 11 used to transmit a signal between the plurality of memory chips 12A to 12F is reduced, and thus the manufacturing cost of the memory module 10 may be reduced.

Hereinafter, structures of the first wiring CA1 and the second wiring CA2 formed in the PCB 11 are described in more detail.

Figure 3:
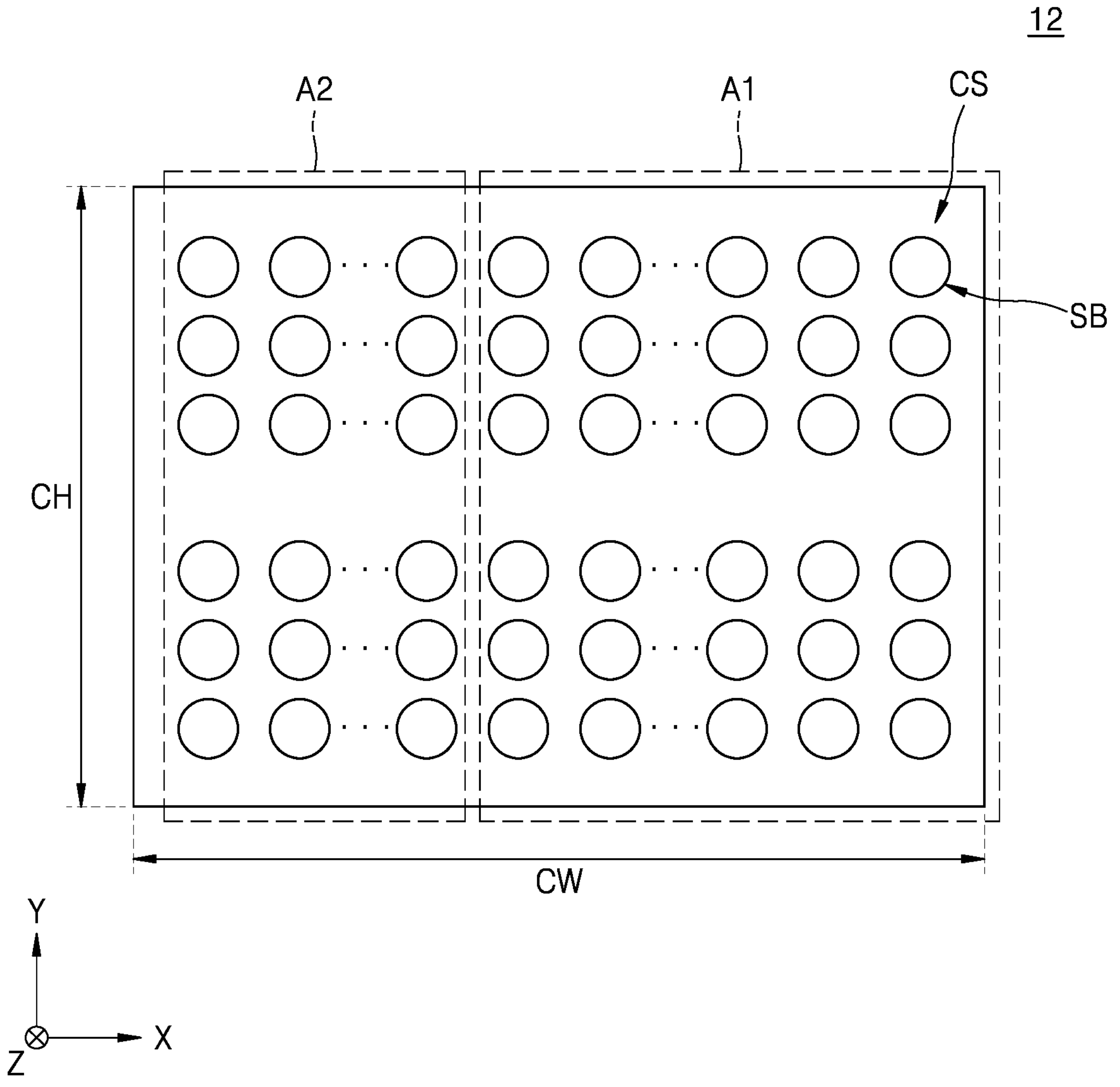
FIG. 3 is a plan view illustrating an arrangement of solder balls according to an embodiment of the present inventive concept.
Figure 4:
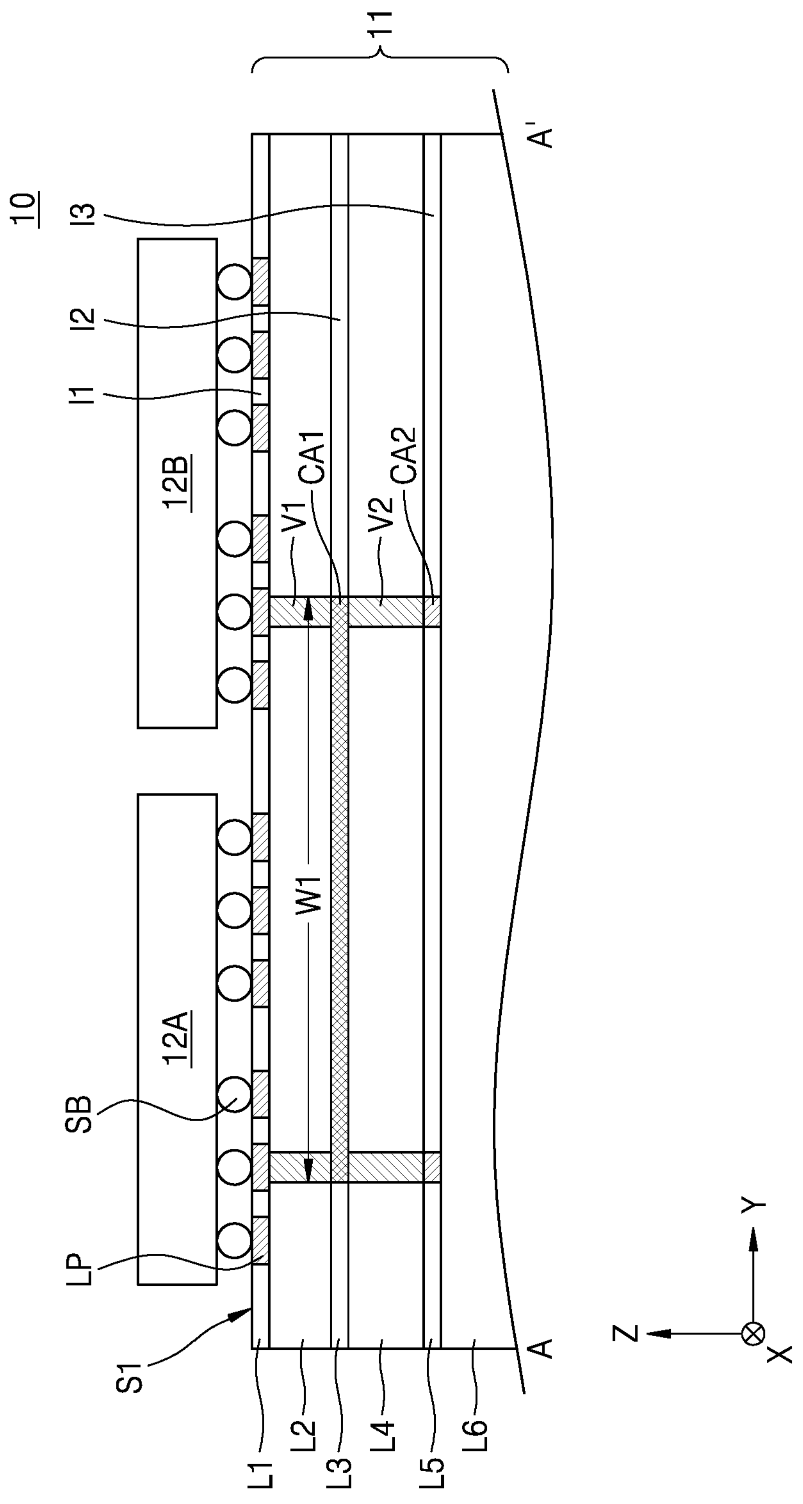
FIG. 4 is a cross-sectional view taken along line A-A' of FIG. 2 illustrating a wiring structure of a memory module according to an embodiment of the present inventive concept.
Figure 5:
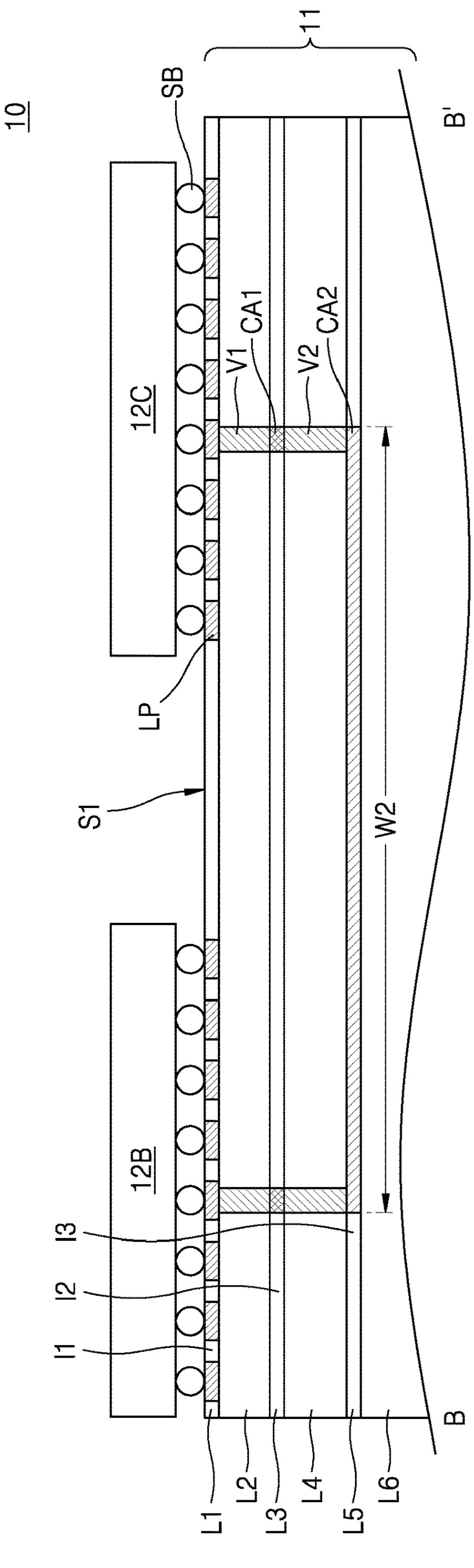
FIG. 5 is a cross-sectional view taken along line B-B' of FIG. 2 illustrating a wiring structure of a memory module according to an embodiment of the present inventive concept.

FIG. 3 is a diagram illustrating solder balls SB according to an embodiment, and FIGS. 4 and 5 are diagrams illustrating a wiring structure of the memory module 10 according to an embodiment. In detail, FIG. 3 is a ball map illustrating the arrangement of the solder balls SB of the memory chip 12 of FIG. 2, and FIG. 4 is a cross-sectional view taken along line A-A' of the memory module 10 of FIG. 2, and FIG. 5 is a cross-sectional view taken along line B-B' of the memory module 10 of FIG. 2.

Referring to FIG. 3, the memory chip 12 may include the plurality of solder balls SB. In an embodiment, the memory chip 12 configured in the form of a ball grid array (BGA) is mainly described. However, embodiments of the present inventive concept are not necessarily limited thereto. For example, in an embodiment, the memory chip 12 may be connected to the PCB 11 in the form of a land grid array (LGA).

The solder balls SB may be disposed on a contact surface CS of the memory chip 12 facing the PCB 11. The solder balls SB may be external connection electrodes. The solder balls SB may be continuously disposed in the first direction X and may be partially discontinuously disposed in the second direction Y. In an embodiment, the number of solder balls SB disposed in the first direction X may be greater than the number of solder balls SB disposed in the second direction Y.

The solder balls SB may be disposed to be divided into a first area A1 and a second area A2. In the first area A1, the solder balls SB may be disposed that are used to provide a command signal controlling an operation of a memory cell or memory circuit integrated in the memory chip 12 and an address signal providing an address position, and, in the second area A2, the solder balls SB may be disposed that are used to input or output data at a designated address. That is, the solder balls SB of the first area A1 may be signal pins for C/A signals, and the solder balls SB of the second area A2 may be signal pins for DQ signals.

Referring to FIGS. 4 and 5, the PCB 11 may be configured as a multi-layer. For example, the PCB 11 may include first to sixth layers L1 to L6. An upper surface of the first layer L1 may be the first surface S1 of the PCB 11. The solder balls SB may contact the upper surface of the first layer L1. The first to sixth layers L1 to L6 are illustrated in the present embodiment. However, embodiments of the present inventive concept are not necessarily limited thereto.

The first layer L1 may include a landing pad LP. The landing pad LP may be exposed on the PCB 11. For example, an upper surface of the landing pad LP may be exposed on the first surface S1 of the PCB 11. The landing pad LP may be connected to the solder balls SB included in the plurality of memory chips 12A to 12F to transmit the C/A signal to the plurality of memory chips 12A to 12F. For example, the plurality of memory chips 12A to 12F may be electrically connected to the PCB 11 through the landing pad LP.

A gap between the landing pads LP may be filled with a first insulating material I1. For example, in an embodiment, the insulating material I1 may include glass or plastic. The insulating material I1 may include chemically tempered/semi-tempered glass such as soda lime glass or aluminosilicate glass, or include reinforced or soft plastics such as polyimide (PI), polyethylene terephthalate (PET), propylene. propylene glycol (PPG), polycarbonate (PC), etc., or include sapphire. In addition, the insulating material I1 may include an optically isotropic film. For example, the insulating material I1 may include cyclic olefin copolymer (COC), cyclic olefin polymer (COP), photoisotropic polycarbonate (PC), photoisotropic polymethyl methacrylate (PMMA), etc.

The second layer L2 may be disposed on a lower portion of the first layer L1. The height (e.g., length in the third direction Z) of the second layer L2 may be higher than the height (e.g., length in the third direction Z) of the first layer L1. In an embodiment, the second layer L2 may include the same material as that of the first insulating material I1. For example, the second layer L2 may include propylene glycol (PPG). The second layer L2 may include a first via V1 connected to the landing pad LP. The first via V1 may be formed through the second layer L2.

A third layer L3 may be disposed under the second layer L2. The third layer L3 may include the first wiring CA1 and a second insulating material I2. The first wiring CA1 may be connected to the landing pad LP through the first via V1, and may be connected to the solder balls SB through the landing pad LP so that the first wiring CA1 may be electrically connected to the memory chips 12A to 12F. As shown in an embodiment of FIG. 2, the first wiring CA1 may be formed in the shape of a straight line extending in the second direction Y. The second insulating material I2 may insulate the first wirings CA1 from each other by filling a gap between the first wirings CA1 (e.g., in the first direction X). In an embodiment, the second insulating material I2 may include the same material as that of the first insulating material I1.

The fourth layer L4 may be disposed on a lower portion of the third layer L3. In an embodiment, the height of the fourth layer L4 may be higher than the heights of the first layer L1 and the third layer L3. In an embodiment, the fourth layer L4 may include the same material as that of the first insulating material I1. For example, the fourth layer L4 may include propylene glycol (PPG). The fourth layer L4 may include a second via V2 connected to the first wiring CA1. The second via V2 may be formed by passing through the fourth layer L4.

The fifth layer L5 may be disposed on a lower portion of the fourth layer L4. The fifth layer L5 may include the second wiring CA2 and a third insulating material I3. The second wiring CA2 may be connected to the first wiring CA1 through the second via V2. For example, the second wiring CA2 may be electrically connected to the memory chips 12A to 12F through the first via V1 and the second via V2. As shown in an embodiment of FIG. 2, the second wiring CA2 may be formed in the shape of a straight line extending between the first direction X and the second direction Y. A length W1 of the first wiring CA1 may be shorter than a length W2 of the second wiring CA2. However, embodiments of the present inventive concept are not necessarily limited thereto.

The third insulating material I3 may insulate the second interconnections CA2 from each other by filling a gap between the second wirings CA2. In an embodiment, the third insulating material I3 may include the same material as that of the first insulating material I1.

The sixth layer L6 may be disposed on a lower portion of the fifth layer L5. In an embodiment, the sixth layer L6 may include the same material as that of the first insulating material I1. For example, the sixth layer L6 may include propylene glycol (PPG).

In an embodiment, the first wiring CA1 and the second wiring CA2 disposed on different layers may be connected to each other through the second via V2, and may be connected to the memory chips 12A to 12F through the first via V1. For example, the first wiring CA1 and the second wiring CA2 may transmit the C/A signal to the plurality of memory chips 12A to 12F through the first via V1 and the second via V2.

In embodiments shown in FIGS. 4-5, the first layer L1 is illustrated as including the landing pad LP. However, embodiments of the present inventive concept are not necessarily limited thereto. For example, in an embodiment a separate layer may be provided between the first layer L1 and the second layer L2. In this embodiment, the first via V1 connecting the landing pad LP and the first wiring CA1 may be formed as a through via penetrating a plurality of layers.

In embodiments shown in FIGS. 4-5, the third layer L3 and the fourth layer L4 are illustrated as being sequentially stacked (e.g., in the third direction Z). However, embodiments of the present inventive concept are not necessarily limited thereto. For example, in an embodiment, a plurality of layers may be further disposed between the third layer L3 and the fourth layer L4 (e.g., in the third direction Z). In this embodiment, the second via V2 connecting the first wiring CA1 and the second wiring CA2 may be formed as a through via penetrating the plurality of layers.

Since the first wiring CA1, the second wiring CA2, the first via V1, the second via V2 and the landing pad LP are wirings that transmit electrical signals, in an embodiment the first wiring CA1, the second wiring CA2, the first via V1, the second via V2 and the landing pad LP may include a metal material having high electrical conductivity. For example, in an embodiment, the first wiring CA1, the second wiring CA2, the first via V1, the second via V2, and the landing pad LP may include at least one compound selected from gold (Au), silver (Ag), platinum (Pt), titanium (Ti), tin (Sn), copper (Cu), and zinc (Zn). In addition, the first wiring CA1, the second wiring CA2, the first via V1, the second via V2, and the landing pad LP may be formed as a paste or solder paste including at least one metal material among gold (Au), silver (Ag), platinum (Pt), titanium (Ti), tin (Sn), copper (Cu), and zinc (Zn) of excellent bonding power. In an embodiment, the first wiring CA1, the second wiring CA2, the first via V1, the second via V2, and the landing pad LP may include copper (Cu) of high electrical conductivity and relatively low price. However, embodiments of the present inventive concept are not necessarily limited thereto.

In an embodiment, the first wiring CA1 and the second wiring CA2 are configured in the shape of a straight line extending in a specific direction, and thus the length of all wirings transmitting the C/A signal may be reduced. Accordingly, the length of wirings through which the C/A signal passes is reduced, and thus, the cross talk phenomenon of the signal may be reduced. For example, it is possible to provide the memory module 10 of increased signal characteristics.

Figure 6:
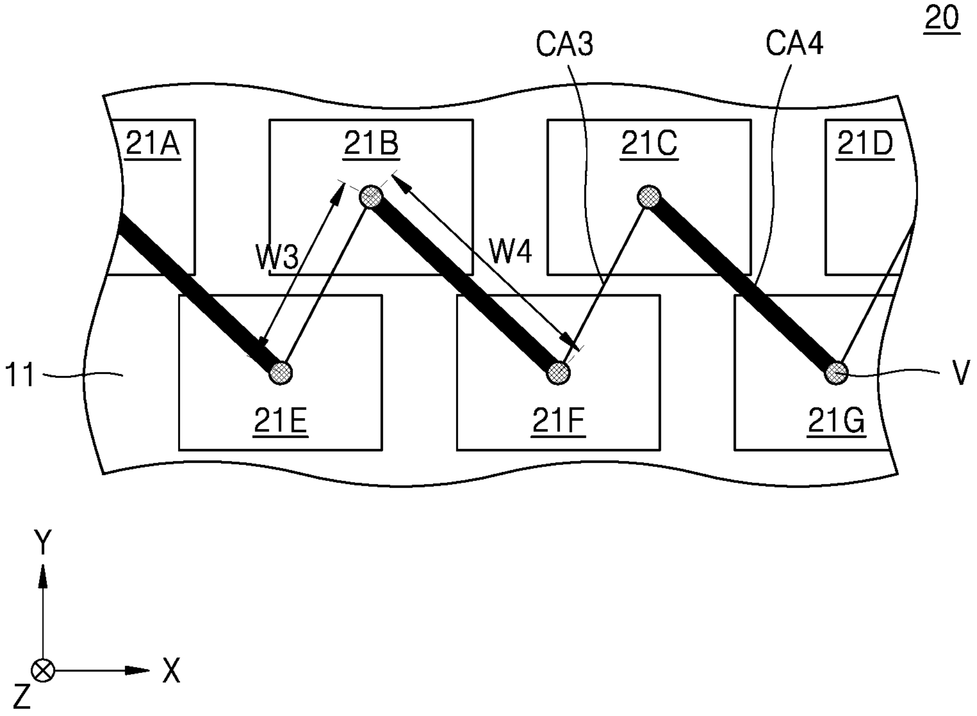
FIG. 6 is a plan view of a memory module according to an embodiment of the present inventive concept.

FIG. 6 is a plan view of a memory module 20 according to an embodiment of the present inventive concept. In detail, FIG. 6 is a diagram illustrating an embodiment in which the memory module 3 of FIG. 1 is implemented. For example, FIG. 6 is an embodiment of FIG. 2.

Hereinafter, FIG. 6 is described with reference to FIGS. 1 to 5, and redundant descriptions are omitted for convenience of explanation.

Referring to FIG. 6, the memory module 20 may include the PCB 11 and memory chips 21A to 21G mounted on the PCB 11.

The PCB 11 may be formed to have a length in the first direction X that is longer than a length in the second direction Y, and a length of each of the plurality of memory chips 21A to 21G in the first direction X may be also longer than a length thereof in the second direction Y. In an embodiment, the plurality of memory chips 21A to 21G may include solder balls arranged as shown in FIG. 4. For example, each of the plurality of memory chips 21A to 21G may include solder balls sequentially arranged in the first direction X and partially discontinuously arranged in the second direction Y. Each of the plurality of memory chips 21A to 21G may be electrically connected to the PCB 11 through the solder balls.

The memory chips 21A to 21G may be spaced apart from each other in the first direction X and the second direction Y. The memory chips 21A to 21G may be arranged in at least two rows, and the memory chips (e.g., 21A, 21B, 21C, and 21D) arranged in a first row and the memory chips (e.g., 21E, 21F, and 21G) arranged in a second row may be displaced from each other (e.g., not aligned in the second direction Y). For example, the plurality of memory chips (e.g., 21A, 21B, 21C, and 21D) disposed in the same row may be disposed on the same axis in the first direction X. The memory chips (e.g., 21A and 21E) adjacent in the second direction Y and disposed in different rows may be disposed on different axes in the second direction Y. In this embodiment, the fifth memory chip 21E may be disposed in a row different from those of the first memory chip 21A and the second memory chip 21B, and may be disposed between the first memory chip 21A and the second memory chip 21B (e.g., in the first direction X). For example, the plurality of memory chips (e.g., 21A, 21B, 21C, and 21D) arranged in the first row and the plurality of memory chips (e.g., 21E, 21F, and 21G) arranged in the second row adjacent to the first row may not be aligned with each other (e.g., in the second direction Y) and may be arranged to have a constant offset from each other.

The PCB 11 may include a third wiring CA3 and a fourth wiring CA4. The third wiring CA3 and the fourth wiring CA4 are formed inside the PCB 11, but are illustrated on the PCB 11 and the memory chips 21A to 21G for convenience of description.

As described above with reference to embodiments of FIGS. 3 to 5, the third wiring CA3 and the fourth wiring CA4 may be included in a C/A signal line transmitting the C/A signal to the plurality of memory chips 21A to 21G through the landing pad LP of the PCB 11 and the solder balls of the plurality of memory chips 21A to 21G.

The C/A signal line may include the third wiring CA3 and the fourth wiring CA4 that are alternately and repeatedly disposed. The third wiring CA3 and the fourth wiring CA4 may be zigzagged inside the PCB 11. For example, as shown in an embodiment of FIG. 6, the third wiring CA3 and the fourth wiring CA4 may be repeatedly arranged in an alternating manner along the first direction X to zigzag-connect the memory chips to each other in which the third wiring CA3 extends in a direction between the first direction X and the second direction Y to connect adjacent memory chips in different rows that are not aligned with each other in the second direction Y (e.g., are diagonally adjacent to each other) and the fourth wiring CA4 extends in a direction between the first direction X and the second direction Y that crosses the extending direction of the third wiring CA3 to connect adjacent memory chips in different rows that are not aligned with each other in the second direction Y (e.g., are diagonally adjacent to each other). In an embodiment, a length W3 of the third wiring CA3 may be the same as a length W4 of the fourth wiring CA4. However, embodiments of the present inventive concept are not necessarily limited thereto. Accordingly, the speed of a signal transmitted between the memory chips 21A to 21G is constantly provided, and thus signal characteristics may be increased.

As described above with reference to embodiments of FIGS. 4 and 5, the third wiring CA3 and the fourth wiring CA4 may be disposed on different layers of the PCB 11, and may be electrically connected to each other through the via V connecting the third wiring CA3 and the fourth wiring CA4. The via V may include the first via (V1 in FIG. 4) and the second via (V2 in FIG. 4) described above with reference to embodiments of FIGS. 4 and 5. The first via may be formed in the third direction Z to connect the third wiring CA3 and the landing pad, and the second via may be formed in the third direction Z to connect the third wiring CA3 and the fourth wiring CA4 to each other. In some embodiments, the via V may be configured as a through via.

In an embodiment, the third wiring CA3 may be disposed in a layer closer to the plurality of memory chips 21A to 21G in the third direction Z than the fourth wiring CA4. However, embodiments of the present inventive concept are not necessarily limited thereto. For example, in an embodiment, the fourth wiring CA4 may be disposed in a layer closer to the plurality of memory chips 21A to 21G in the third direction Z than the third wiring CA3.

Figure 7:
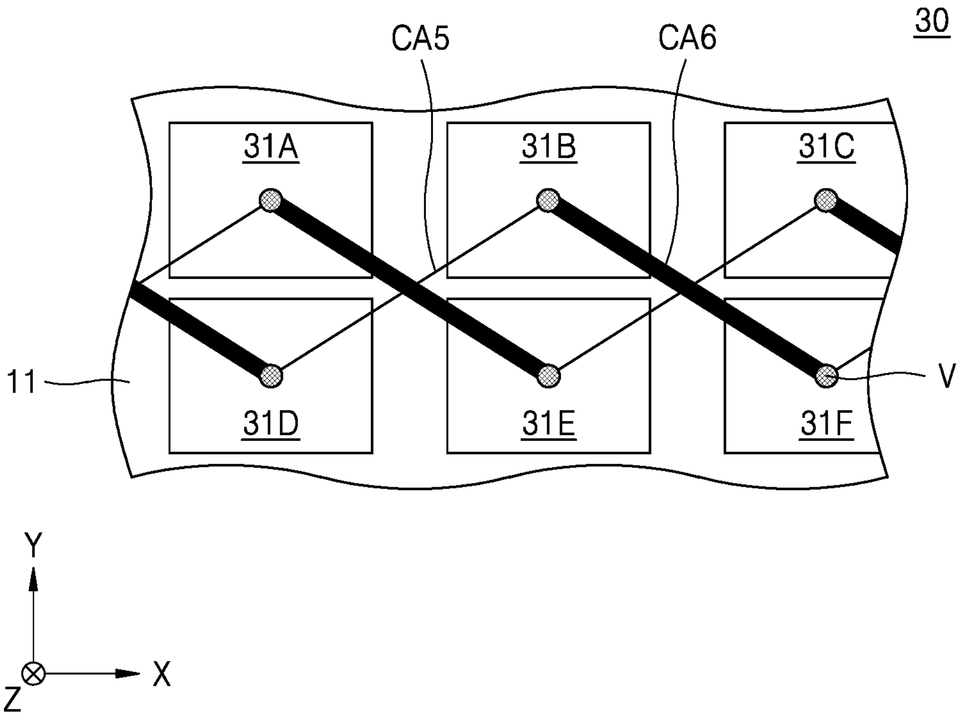
FIG. 7 is a plan view of a memory module according to an embodiment of the present inventive concept.

FIG. 7 is a plan view of a memory module 30 according to an embodiment. In detail, FIG. 7 is a diagram illustrating an embodiment in which the memory module 3 of FIG. 1 is implemented. That is, FIG. 7 is an embodiment of FIG. 2. Hereinafter, FIG. 7 is described with reference to FIGS. 1 to 5, and redundant descriptions are omitted for convenience of explanation.

Referring to FIG. 7, the memory module 30 may include the PCB 11 and memory chips 31A to 31F mounted on the PCB 11.

The PCB 11 may be formed to have a length in the first direction X that is longer than a length in the second direction Y, and each of the plurality of memory chips (31A to 31F) may be disposed to have a length in the first direction X that is longer than a length in the second direction Y. In an embodiment, the plurality of memory chips 31A to 31F may include solder balls arranged as shown in an embodiment of FIG. 3. For example, each of the plurality of memory chips 31A to 31F may include solder balls sequentially arranged in the first direction X and partially discontinuously arranged in the second direction Y. Each of the plurality of memory chips 31A to 31F may be electrically connected to the PCB 11 through the solder balls.

The memory chips 31A to 31F may be spaced apart from each other in the first direction X and the second direction Y. The memory chips 31A to 31F may be arranged in at least two rows, and the memory chips (e.g., 31A, 31B, and 31C) arranged in a first row may be arranged with the memory chips (e.g., 31D, 31E, and 31F) arranged in a second row side by side. For example, the plurality of memory chips (e.g., 31A, 31B, and 31C) arranged in the same row may be arranged on the same axis in the first direction X. The memory chips (e.g., 31A and 31D) adjacent in the second direction Y and disposed in different rows may be disposed on the same axis in the second direction Y.

The PCB 11 may include a fifth wiring CA5 and a sixth wiring CA6. The fifth and sixth wirings CA5 and CA6 are formed inside the PCB 11, but are illustrated on the PCB 11 and the memory chips 31A to 31F for convenience of description.

As described above with reference to FIGS. 3 to 5, the fifth wiring CA5 and the sixth wiring CA6 may transmit signals to the plurality of memory chips 31A to 31F through the landing pad LP of the PCB 11 and the solder balls of the plurality of memory chips 31A to 31F. For example, the fifth wiring CA5 and the sixth wiring CA6 may be included in a C/A signal line for transmitting a C/A signal to the memory chips 31A to 31F.

The C/A signal line may include the fifth wiring CA5 and the sixth wiring CA6 that are alternately and repeatedly disposed. The fifth wiring CA5 and the sixth wiring CA6 may be zigzagged inside the PCB 11. The fifth wiring CA5 may be formed in the shape of a straight line extending in a direction between the first direction X and the second direction Y, and the sixth wiring CA6 may be formed in the shape of a straight line extending in a direction between the first direction X and the second direction Y and crossing the extending direction of the fifth wiring CA5. The fifth wiring CA5 and the sixth wiring CA6 may overlap each other in the second direction Y and may cross each other. For example, as shown in an embodiment of FIG. 7, the fifth and sixth wirings CA5, CA6 may cross each other in a region between diagonally-adjacent memory chips (e.g., memory chips 31A and 31E and memory chips 31D and 31B). In an embodiment, the lengths of the fifth wiring CA5 and the sixth wiring CA6 may be the same. Accordingly, the speed of a signal transmitted between the memory chips 21A to 21G is constantly provided, and thus signal characteristics may be increased.

As described above with reference to FIGS. 4 and 5, the fifth wiring CA5 and the sixth wiring CA6 may be disposed on different layers of the PCB 11 and may be electrically connected to each other through the via V. The via V may include the first via (V1 in FIG. 4) and the second via (V2 in FIG. 4) described above with reference to embodiments of FIGS. 4 and 5. The first via (V1 in FIG. 4) may be formed in the third direction Z to connect the fifth wiring CA5 and the landing pad, and the second via (V2 in FIG. 4) may be formed in the third direction Z to connect the fifth wiring CA5 and the sixth wiring CA6. According to an embodiment, the via V may be configured as a through via. In the present embodiment, the via V may not be formed in a portion where the fifth wiring CA5 and the sixth wiring CA6 intersect. For example, in an embodiment, the via V may be formed only at the edges of the fifth and sixth wirings CA5 and CA6.

According to an embodiment, the fifth wiring CA5 may be disposed on a layer closer to the plurality of memory chips 31A to 31F than the sixth wiring CA6. However, embodiments of the present inventive concept are not necessarily limited thereto. For example, in an embodiment, the sixth wiring CA6 may be disposed in a layer closer to the plurality of memory chips 31A to 31F than the fifth wiring CA5.

Figure 8A:
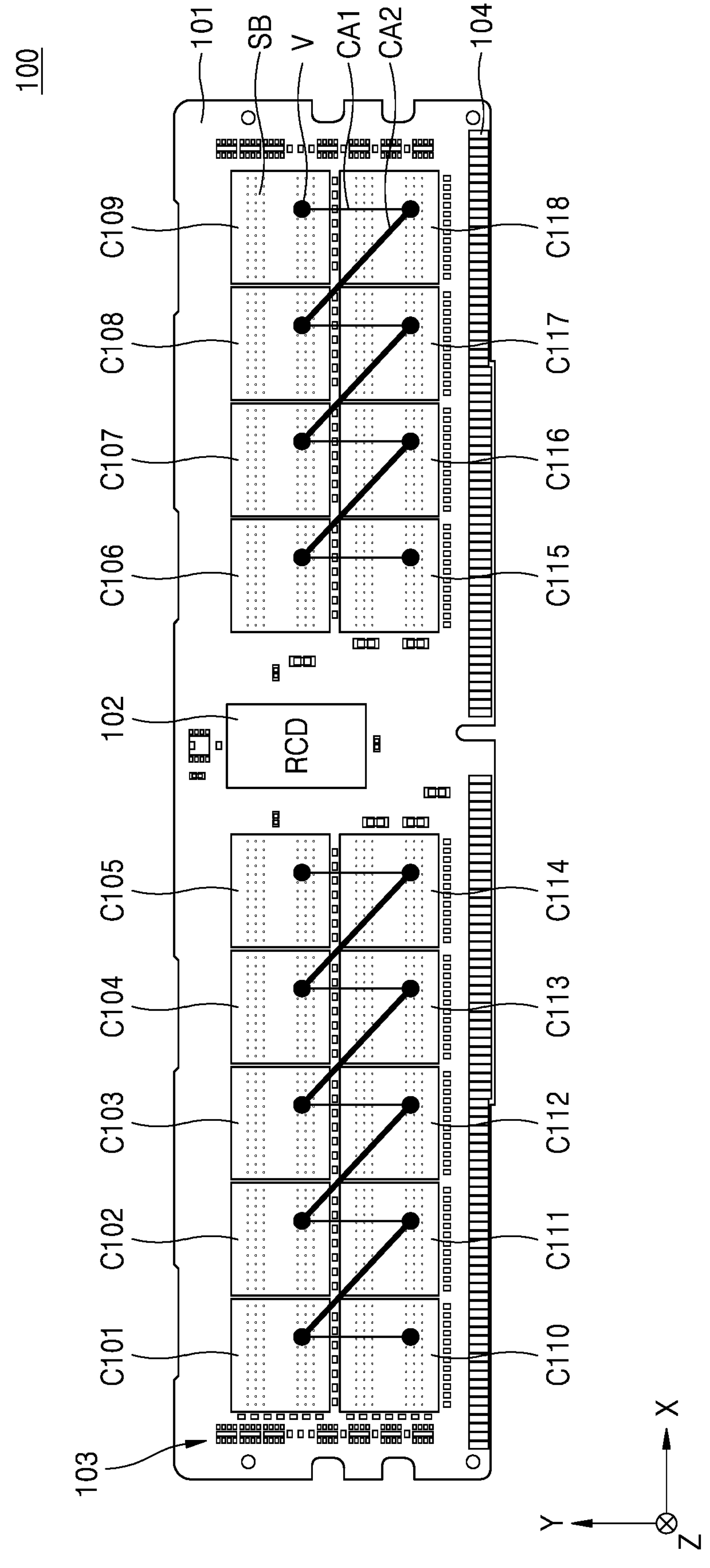
FIGS. 8A and 8B are plan views of memory modules according to embodiments of the present inventive concept.
Figure 8B:
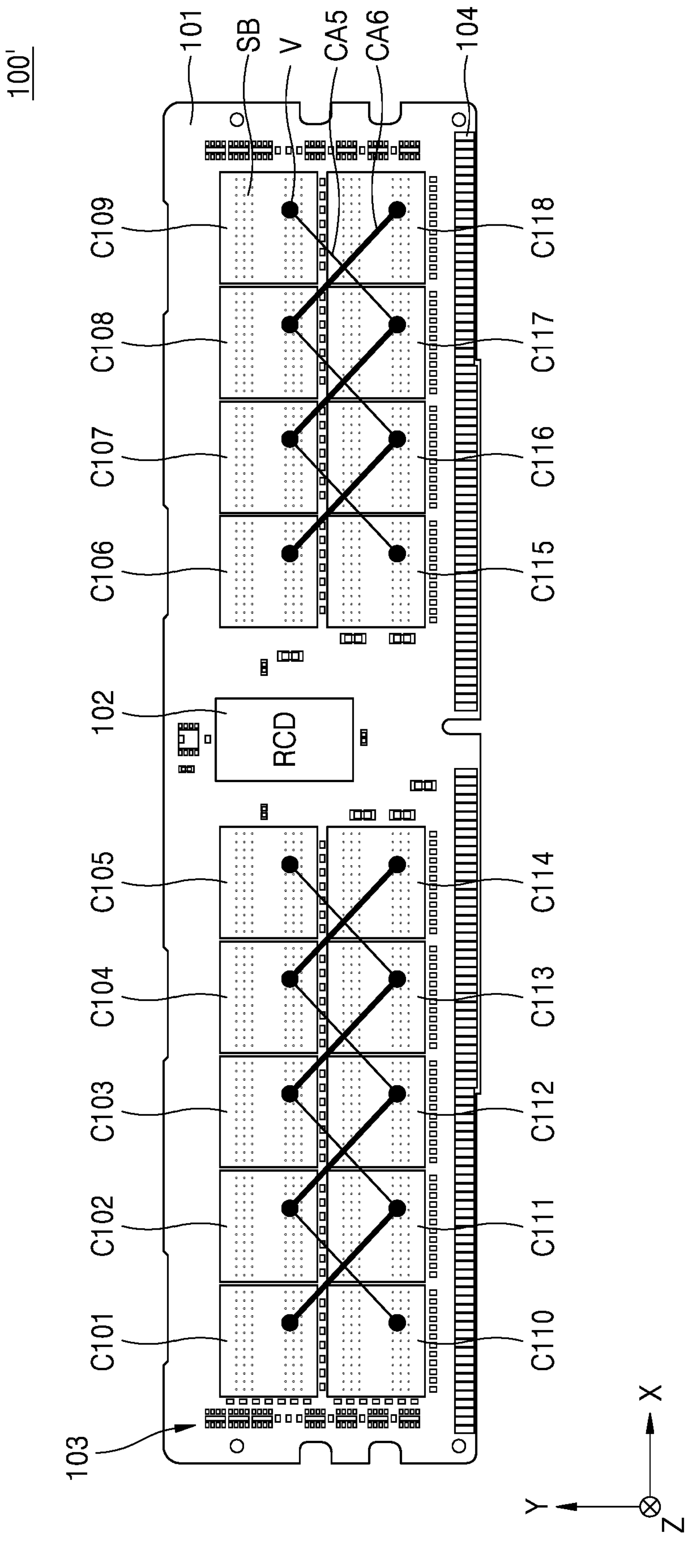

FIGS. 8A and 8B are diagrams illustrating memory modules 100 and 100' according to an embodiment. In detail, FIGS. 8A and 8B may illustrate an embodiment of the memory module 3 of FIG. 1. Hereinafter, the memory modules 100 and 100' are described with reference to FIGS. 1 to 5.

Referring to FIG. 8A, the memory module 100 may be implemented as a dual in-line memory module (DIMM) conforming to the joint electron device engineering council (JEDEC) standard. For example, in an embodiment, the memory module 100 may include a registered DIMM (RDIMM), a load reduced DIMM (LRDIMM), an unbuffered DIMM (UDIMM), a fully buffered DIMM (FB-DIMM), or a small outline DIMM (SO-DIMM).

The memory module 100 may include memory chips C101 to C118, a registered clock driver (RCD) controller 102, and a tab 104 disposed on a PCB 101.

The memory chips C101 to C118 may be arranged to have a length in the first direction X longer than a length in the second direction Y. The solder balls SB included in each of the memory chips C101 to C118 may be sequentially arranged in the first direction X and partially discontinuously arranged in the second direction Y.

In an embodiment, the memory chips C101 to C118 may be arranged in two rows. Some of the memory chips C101 to C118 may be disposed on the left side of the RCD controller 102 (e.g., in the first direction X), and the others of the memory chips C101 to C118 may be disposed on the right side of the RCD controller 102 (e.g., in the first direction X). The memory chips C101 to C118 arranged in different rows may be arranged side by side. For example, the memory chips (e.g., C101 and C110) adjacent in the second direction Y may be disposed on the same axis in the second direction Y.

FIG. 8A illustrates 18 memory chips C101 to C118 disposed on a first surface 103 of the PCB 101. However, embodiments of the present inventive concept are not necessarily limited thereto, and the memory module 100 may further include 18 memory chips disposed on a second surface opposite to the first surface 103 of the PCB 101. The memory chips disposed on the first surface 103 of the PCB 101 and the memory chips disposed on the second surface of the PCB 101 may constitute different memory ranks.

In an embodiment, some of the memory chips C101 to C118 may be configured as error correction code (ECC) chips. The ECC chip may be a memory chip that provides an ECC for stored data. In an embodiment, the ECC may include at least one of a parity and a cyclic redundancy code (CRC).

The memory chips C101 to C118 may operate in response to a C/A signal and a DQ signal. As described above with reference to embodiments of FIGS. 2 to 5, a C/A signal line including a wiring zigzagged inside the PCB 101 may be formed to transmit the C/A signal to the memory chips C101 to C118. The C/A signal line may include the first wiring CA1 and the second wiring CA2 formed in the shape of a straight line inside the PCB 101. The first wiring CA1 and the second wiring CA2 may respectively correspond to the first wiring CA1 and the second wiring CA2 of an embodiment of FIG. 2.

For example, the first memory chip C101 and the second memory chip C110 may be connected through the first wiring CA1 configured in the shape of a straight line extending in the second direction Y, and the second memory chip C110 and the third memory chip C102 may be connected to each other through the second wiring CA2 configured in the shape of a straight line extending in a direction between the first direction X and the second direction Y.

The first wiring CA1 and the second wiring CA2 may use different layers to form a wiring structure. The first wiring CA1 and the second wiring CA2 may be electrically connected to each other through the via V.

The RCD controller 102 may control the memory chips C101 to C118 under the control of the memory controller (2 of FIG. 1) that controls the memory module 100. For example, the RCD controller 102 may receive the C/A signal (C/A of FIG. 1) and the DQ signal (DQ of FIG. 1) from the memory controller (2 of FIG. 1). In an embodiment, the RCD controller 102 may further receive a clock signal and a control signal from the memory controller (2 of FIG. 1). The RCD controller 102 may control the memory chips C101 to C118 in response to the received signals. The RCD controller 102 may perform a buffer function.

The tab 104 may be a path transmitting and receiving signals between the memory module 100 and an external device. The tabs 104 may be formed on edge portions of the first surface 103 and the second surface opposite to (e.g., in the third direction Z) the first surface 103 of the PCB 101. The tab 104 may have a plurality of connecting terminals, also referred to as 'tab pins'. C/A signal input pins, no connection pins, and DQ signal pins may be assigned to the tab 104. The memory module 100 may be electrically connected to a main board of an electronic circuit system such as a personal computer or a workstation through the tab 104.

Referring to an embodiment of FIG. 8B, the memory module 100' may be an embodiment of the memory module 100 of FIG. 8A. The same reference numerals denote the same elements, and redundant descriptions are omitted for convenience of explanation.

The memory chips C101 to C118 may operate in response to the C/A signal and the DQ signal. Referring to embodiments of FIGS. 3 to 5, 7 and 8A, the C/A signal line including the wiring zigzagged inside the substrate 101 may be formed to transmit the C/A signal to the memory chips C101 to C118. The C/A signal line may have a wiring structure zigzagged in units of two rows.

The C/A signal line may include the fifth wiring CA5 and the sixth wiring CA6 formed in the shape of a straight line inside the substrate 101. The fifth wiring CA5 and the sixth wiring CA6 may respectively correspond to the fifth wiring CA5 and the sixth wiring CA6 of an embodiment of FIG. 7. The fifth wiring CA5 may be in the shape of a straight line extending in a direction between the first direction X and the second direction Y, and the sixth wiring CA6 may be in the shape of a straight line extending in a direction between the first direction X and the second direction Y and crossing the fifth wiring CA5. The fifth wiring CA5 and the sixth wiring CA6 may be formed on different layers. In an embodiment, the lengths of the fifth wiring CA5 and the sixth wiring CA6 may be the same.

Figure 9:
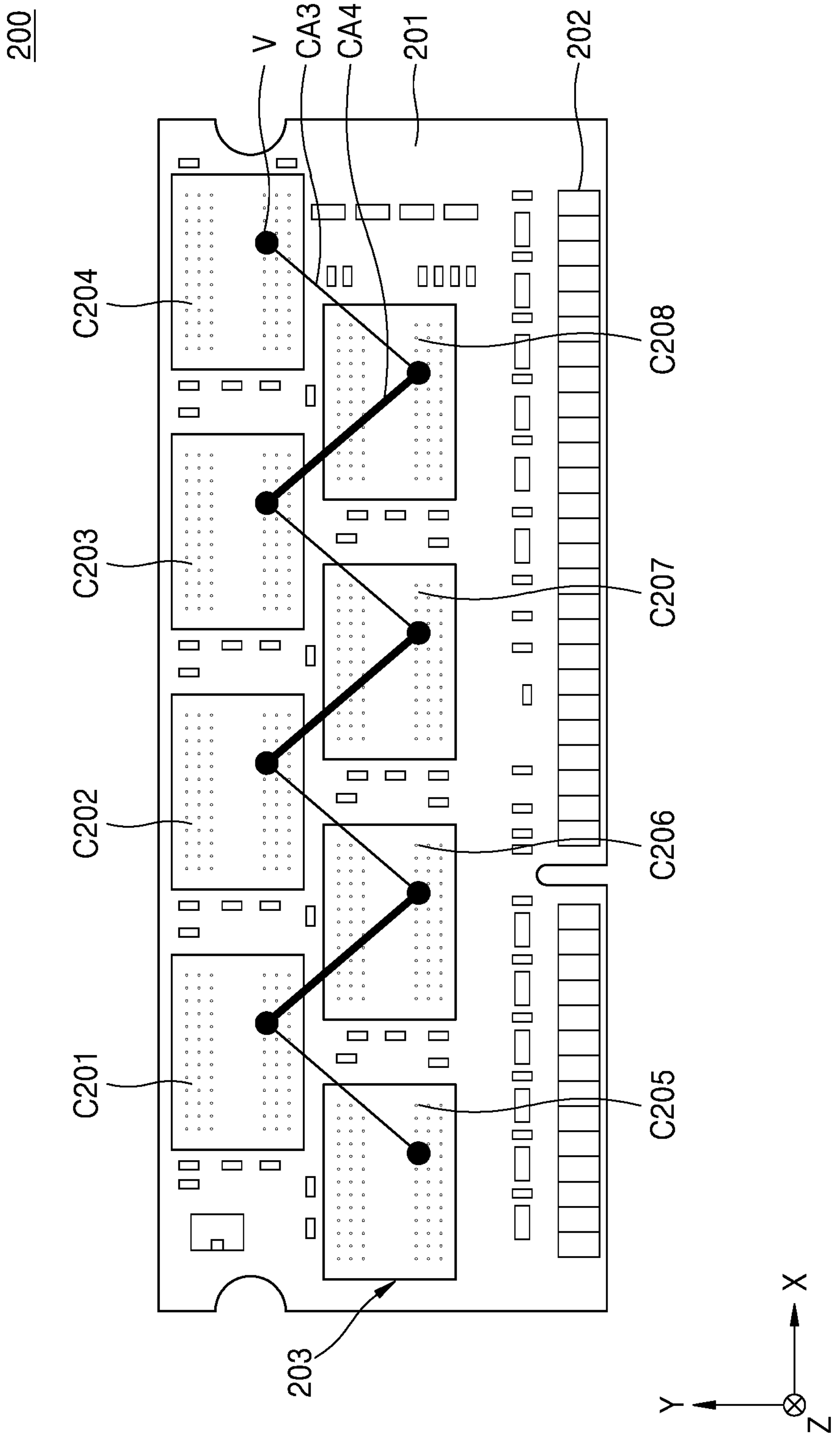
FIG. 9 is a plan view of a memory module according to an embodiment of the present inventive concept.

FIG. 9 is a diagram illustrating a memory module 200 according to an embodiment. Specifically, FIG. 9 may illustrate an embodiment of the memory module 3 of FIG. 1. Hereinafter, the memory module 200 is described with reference to embodiments of FIGS. 1 to 5.

Referring to an embodiment of FIG. 9, the memory module 200 may be a small outline dual in-line memory module (SODIMM) used in a device that emphasizes mobility, such as a mobile device or a notebook computer, among memory modules adopting a dual in-line memory module (DIMM) type structure.

The memory module 200 may include memory chips C201 to C208 and a tab 202 disposed on a PCB 201.

The memory chips C201 to C208 may be arranged so that a length in the first direction X is longer than a length in the second direction Y, and the solder balls SB included in each of the memory chips C201 to C208 may be continuously arranged in the first direction X.

The memory chips C201 to C208 may be arranged in two rows. The memory chips C201 to C208 may be uniformly disposed at regular intervals in the first direction X. The memory chips C201 to C208 arranged in different rows may be alternately arranged in the second direction Y. For example, the memory chips (e.g., C201, C202, C203, and C204) arranged in a first row may be disposed in the second direction Y on an axis different from those of the memory chips (e.g., C206, C207, and C208) arranged in a second row.

In FIG. 9, 8 memory chips C201 to C208 disposed on a first surface 203 of the PCB 201 are shown. However, embodiments of the present inventive concept are not necessarily limited thereto. For example, the memory module 200 may further include 8 memory chips disposed on a second surface opposite to the first surface 203 of the PCB 201. The memory chips disposed on the first surface 203 of the PCB 201 and the memory chips disposed on the second surface of the PCB 201 may constitute different memory ranks. In an embodiment, some of the memory chips C201 to C208 may be configured as ECC chips.

The memory chips C201 to C208 may operate in response to a C/A signal and a DQ signal. As described above in an embodiment of FIG. 6, the third and fourth wirings CA3 and CA4 formed in the shape of a straight line inside the PCB 201 may be zigzagged to transmit the C/A signal to the memory chips C201 to C208. The lengths of the third wiring CA3 and the fourth wiring CA4 may be the same. The third wiring CA3 and the fourth wiring CA4 may be disposed on different layers, and may be electrically connected to each other through the via V.

Figure 10:
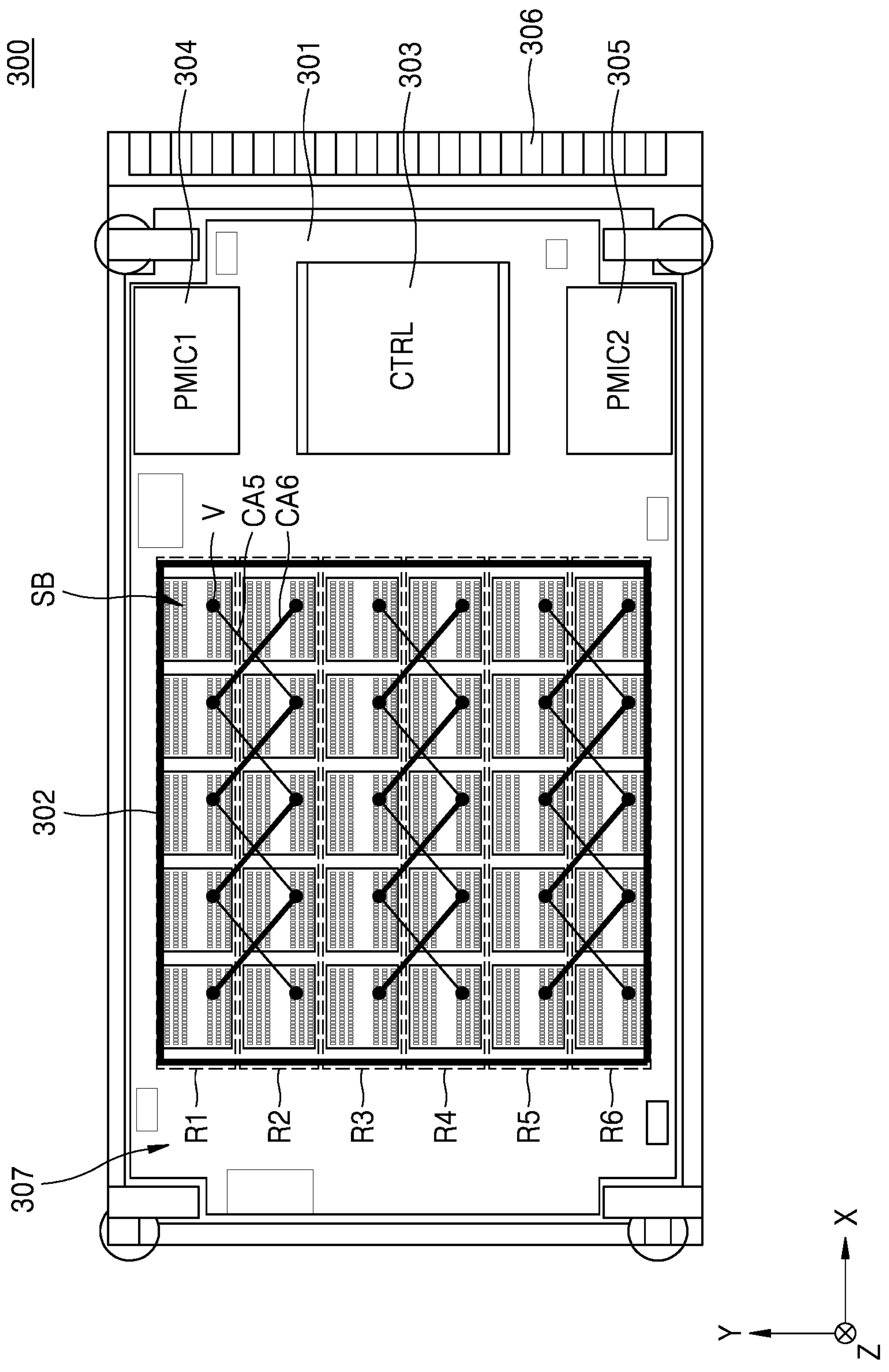
FIG. 10 is a plan view of a memory module according to an embodiment of the present inventive concept.

FIG. 10 is a diagram illustrating a memory module 300 according to an embodiment. In detail, FIG. 10 may illustrate an embodiment of the memory module 3 of FIG. 1. Hereinafter, the memory module 300 is described with reference to embodiments of FIGS. 1 to 5.

Referring to an embodiment of FIG. 10, the memory module 300 may include memory chips 302, a controller 303, a first power management IC (PMIC) 304, a second PMIC 305, and a tab 306 disposed on a PCB 301.

The memory chips 302 may be arranged so that a length in the first direction X is longer than a length in the second direction Y, and the solder balls SB included in each of the memory chips 302 may be continuously arranged in the first direction X, and partially discontinuously arranged in the second direction Y.

The memory chips 302 may be disposed at regular intervals in the first direction X and the second direction Y. In an embodiment, the memory chips 302 may be arranged in six rows, and five memory chips may be arranged in each row. The memory chips 302 arranged in different rows may be arranged side by side (e.g., to be aligned with each other in the second direction Y).

In FIG. 10, 30 memory chips 302 are disposed on a first surface 307 of the PCB 301 are illustrated. However, embodiments of the present inventive concept are not necessarily limited thereto. For example, in an embodiment the memory module 300 may further include 30 memory chips disposed on a second surface opposite to the first surface 307 of the PCB 301. The memory chips disposed on the first surface 307 of the PCB 301 and the memory chips disposed on the second surface of the PCB 301 may constitute different memory ranks.

In an embodiment, some of the memory chips 302 may be configured as ECC chips. The ECC chip may be a memory chip that provides an ECC for stored data. In an embodiment, the ECC may include at least one of parity and a cyclic redundancy code (CRC).

The memory chips 302 may operate in response to a C/A signal and a DQ signal. As described above in an embodiment of FIG. 7, the fifth and sixth wirings CA5 and CA6 formed in the shape of a straight line may be zigzagged inside the PCB 301 to transmit the C/A signal to the memory chips 302.

In the memory chips 302, wirings may be formed in units of two rows. For example, the wirings transmitting the C/A signal may be zigzagged between a first row R1 and a second row R2, between a third row R3 and a fourth row R4, and between a fifth row R5 and a sixth row R6. The memory chips 302 may be wired in units of two rows in the same manner as described above with reference to FIG. 7.

For example, the wiring structure zigzagged in units of two rows may include the fifth wiring CA5 in the shape of a straight line extending in a direction between the first direction X and the second direction Y and the sixth wiring CA6 in the shape of a straight line extending in a direction between the first direction X and the second direction Y and crossing the fifth wiring CA5. The fifth wiring CA5 and the sixth wiring CA6 may be formed on different layers. The lengths of the fifth wiring CA5 and the sixth wiring CA6 may be the same.

The controller 303 may control the memory chips 302, the first PMIC 304, and the second PMIC 305 under the control of the memory controller (2 of FIG. 1) that controls the memory module 300. For example, the controller 303 may receive the C/A signal (C/A of FIG. 1) and the DQ signal (DQ of FIG. 1) from the memory controller (2 of FIG. 1). In an embodiment, the controller 303 may further receive a clock signal and a control signal from the memory controller (2 of FIG. 1). The controller 303 may control the memory chips 302 in response to the received signals. The controller 303 may perform a buffer function.

The first PMIC 304 and the second PMIC 305 may receive external power to generate a power supply voltage and supply the generated power voltage to the plurality of memory chips 302. The plurality of memory chips 302 may operate by receiving power supply voltage from the first PMIC 304 and the second PMIC 305.

The tab 306 may be a path transmitting and receiving a signal between the memory module 300 and an external device. The tabs 306 may be formed on edge portions of the first surface 307 and a second surface opposite to the first surface 307 (e.g., in the third direction Z) of the PCB 301. The tab 306 may have a plurality of connecting terminals, also referred to as 'tab pins'. C/A signal input pins and DQ signal pins may be assigned to the tap 306. The memory module 300 may be electrically connected to a main board of an electronic circuit system such as a personal computer or a workstation through the tab 306.

Figure 11:
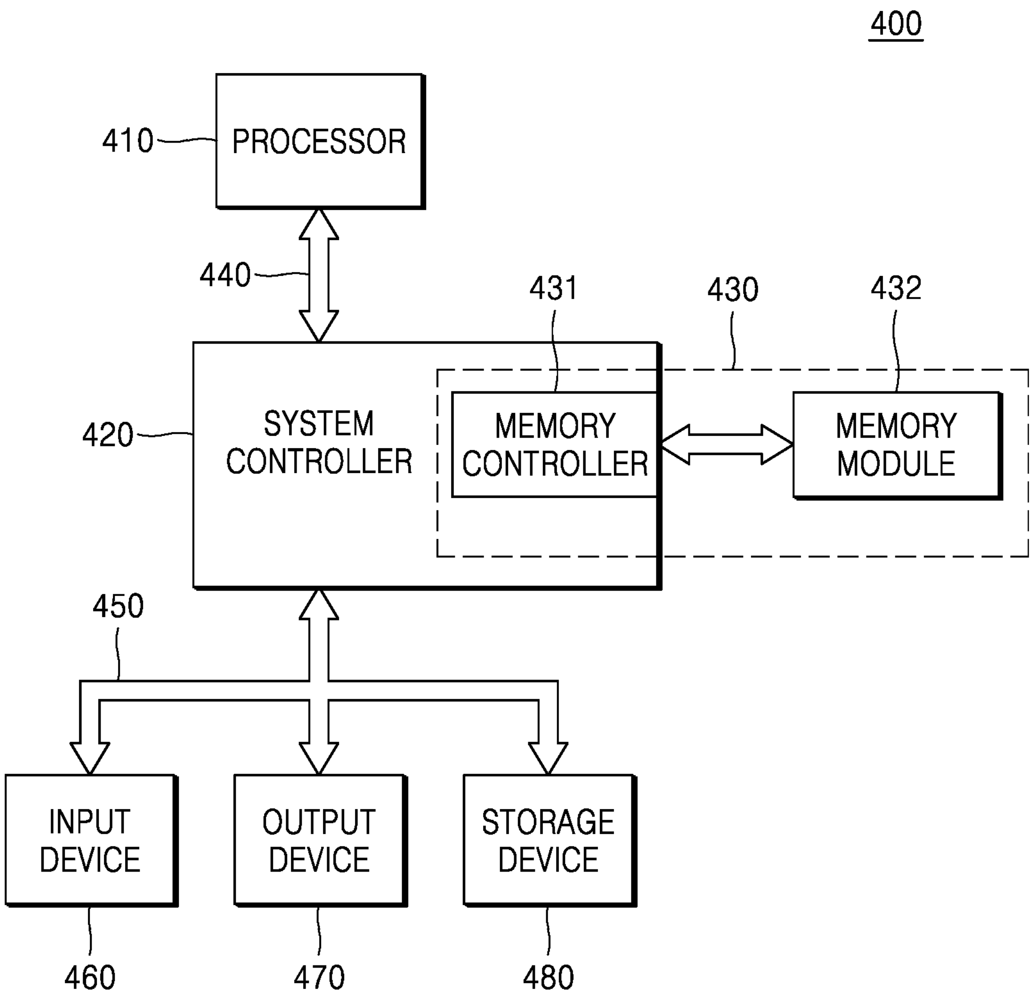
FIG. 11 is a block diagram illustrating an a memory module in a computing system according to an embodiment of the present inventive concept.

FIG. 11 is a block diagram illustrating an embodiment of including a memory module in a computing system 400.

Referring to an embodiment of FIG. 11, the computing system 400 may include a processor 410, a system controller 420, and a memory system 430. The computing system 400 may further include a processor bus 440, an expansion bus 450, an input device 460, an output device 470, and a storage device 480.

The computing system 400 may be modified or applied to one of various elements of an electronic device, such as a ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a 3-dimensional television, a digital audio recorder, a digital audio player, a digital picture recorder, a digital picture player, a digital video recorder, a digital video player, storage constituting a data center, a device capable of transmitting and receiving information in a wireless environment, one of various electronic devices constituting a home network, one of various electronic devices constituting a computer network, one of various electronic devices constituting a telematics network, an RFID device, or one of various elements constituting the computing system 400.

The processor 410 may execute various computing functions, such as executing specific software to perform specific calculations or tasks. For example, the processor 410 may be a microprocessor or central processing unit. The processor 410 may be connected to the system controller 420 through the processor bus 440 including an address bus, a control bus, and/or a data bus.

A host interface between the processor 410 and the system controller 420 includes various protocols for performing data exchange. For example, in an embodiment, the system controller 420 may be configured to communicate with a host or the outside through at least one of various interface protocols such as a universal serial bus (USB) protocol, a multimedia card (MMC) protocol, a peripheral component interconnection (PCI) protocol, a PCI-express (PCI-E) protocol, an Advanced Technology Attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, etc.

The system controller 420 is connected to the expansion bus 450, such as a peripheral component interconnect (PCI) bus. Accordingly, the processor 410 may control, through the system controller 420, one or more input devices 460 such as a keyboard or mouse, one or more output devices 470 such as a printer or a display device, or one or more storage devices 480 such as a hard disk drive, a solid state drive, or a CD-ROM.

The memory controller 431 may control a memory module 432 to perform a command provided by the processor 410. The memory module 432 may store data provided from the memory controller 431 and provide the stored data to the memory controller 431.

The memory module 432 may include a plurality of semiconductor memory devices, for example, a volatile memory including a dynamic random access memory (DRAM) and a static random access memory (SRAM), or a nonvolatile memory. In an embodiment, the volatile memory may include dynamic random access memory (DRAM), static random access memory (SRAM), thyristor RAM (TRAM), zero capacitor RAM (Z-RAM), or twin transistor RAM (TTRAM) or MRAM. The nonvolatile memory may include Electrically Erasable Programmable Read-Only Memory (EEPROM), flash memory, magnetic RAM (MRAM), spin-transfer torque MRAM, conductive bridging RAM (CBRAM), ferroelectric RAM (FeRAM), phase change RAM (PRAM), resistive RAM (RRAM), nanotube RRAM, polymer RAM (PoRAM), nano floating gate memory (NFGM), holographic memory, a molecular electronics memory device, or an insulator resistance change memory. One bit or more bits may be stored in a unit cell of the nonvolatile memory.

The memory module 432 may correspond to the memory module described above with reference to embodiments of FIGS. 2 to 10, and the plurality of semiconductor memory devices may correspond to the plurality of memory chips described above with reference to embodiments of FIGS. 2 to 10. For example, the memory module 432 may be formed based on a PCB which is zigzag wired to transmit a C/A signal.

Figure 12:
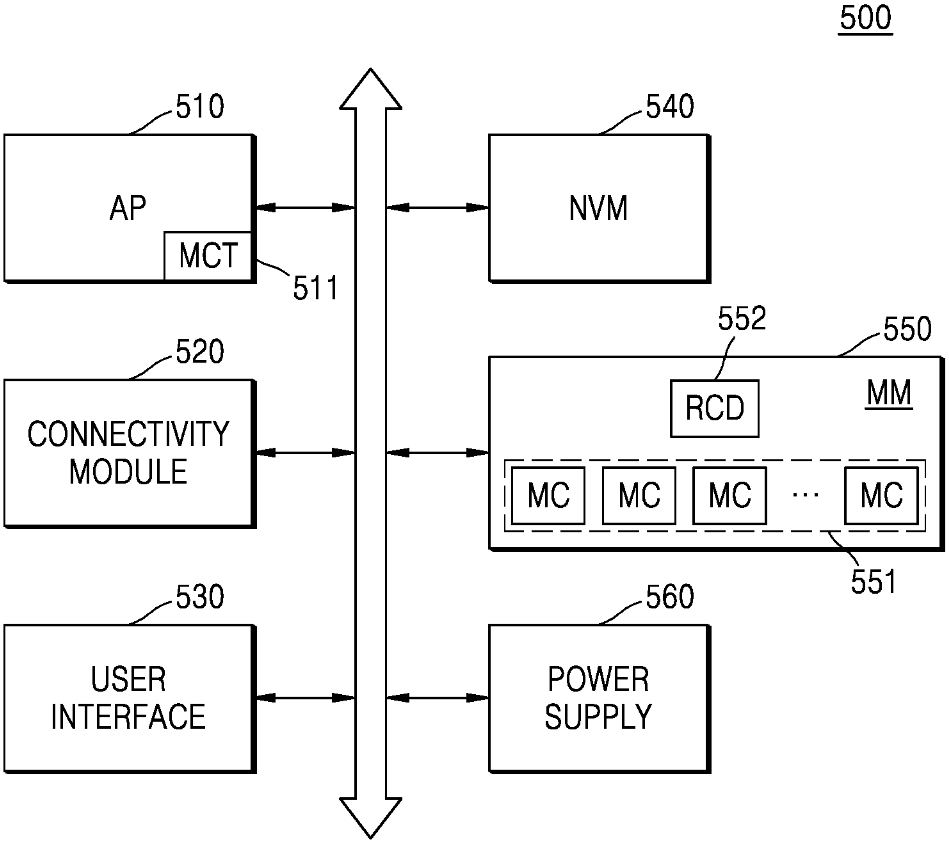
FIG. 12 is a block diagram illustrating a memory module in a mobile system according to an embodiment of the present inventive concept.

FIG. 12 is a block diagram illustrating an embodiment of including a memory module in a mobile system 500.

Referring to an embodiment of FIG. 12, the mobile system 500 includes an application processor 910, a connectivity module 520, a user interface 530, a nonvolatile memory device 540, a memory module 550, and a power supply 560. The application processor 510 may include a memory controller 511.

In an embodiment, the application processor 510 may execute applications that provide an Internet browser, a game, a video, etc. The connectivity module 520 may perform wireless communication or wired communication with an external device. The user interface 530 may include one or more input devices, such as a keypad, a touch screen, and/or one or more output devices, such as a speaker and a display device. The nonvolatile memory device 540 may store a boot image for booting the mobile system 500.

The memory module 550 may store data processed by the application processor 510 or may operate as a working memory. The memory module 550 may include a plurality of memory chips 551 and an RCD controller 552. The memory module 550 may correspond to the memory module described above with reference to embodiments of FIGS. 2 to 10. For example, the memory module 550 may be formed based on a PCB that is zigzag wired to transmit a C/A signal.

The power supply 560 may supply the operating voltage of the mobile system 500. The mobile system 500 or elements of the mobile system 500 may be mounted using various types of packages.

While the present inventive concept have been particularly shown and described with reference to embodiments thereof, it will be understood that various changes in form and details may be made therein without departing from the spirit and scope of the present inventive concept.

What is claimed is:

1. A memory module comprising:

a printed circuit board (PCB) comprising a multi-layer, wherein a length of the PCB in a first direction is longer than a length of the PCB in a second direction perpendicular to the first direction;

a first memory chip mounted on the PCB, wherein a length of the first memory chip in the first direction is longer than a length of the first memory chip in the second direction;

a second memory chip spaced apart from the first memory chip in the second direction, wherein a length of the second memory chip in the first direction is longer than a length of the second memory chip in the second direction;

a third memory chip spaced apart from the first memory chip in the first direction, wherein a length of the third memory chip in the first direction is longer than a length of the third memory chip in the second direction;

a fourth memory chip spaced apart from the second memory chip in the first direction, wherein a length of the fourth memory chip in the first direction is longer than a length of the fourth memory chip in the second direction; and a signal line transmitting a command/address signal to each of the first to fourth memory chips, wherein the signal line comprises a first wiring formed inside the PCB, the first wiring connecting the first memory chip to the second memory chip, and connecting the third memory chip to the fourth memory chip; and a second wiring formed inside the PCB, the second wiring connecting the second memory chip to the third memory chip, and wherein each of the first memory chip, the second memory chip, the third memory chip, and the fourth memory chip comprises:

a first area and a second area; and a plurality of solder balls arranged at regular intervals in the first direction and arranged at irregular intervals in the second direction, wherein a first set of the plurality of solder balls are disposed in the first area and a second set of the plurality of solder balls are disposed in the second area, wherein the first set of the plurality of solder balls are electrically connected to the PCB and configured to provide the command/address signal, and wherein the second set of the plurality of solder balls are electrically connected to the PCB and configured to provide a data input/output signal.

2. The memory module of claim 1, wherein the first wiring and the second wiring are disposed in different layers of the multi-layer from each other.

3. The memory module of claim 2, further comprising:

a landing pad disposed on the PCB and including an exposed surface, the landing pad electrically connecting each of the first to fourth memory chips to the PCB;

a first via electrically connecting the landing pad to the first wiring; and a second via electrically connecting the first wiring to the second wiring.

4. The memory module of claim 1, wherein:

the second memory chip is disposed on a same axis as an axis of the first memory chip in the second direction; and the fourth memory chip is disposed on a same axis as an axis of the third memory chip in the second direction.

5. The memory module of claim 4, wherein:

the first wiring is in a shape of a straight line extending in the second direction; and the second wiring is in a shape of a straight line extending in a direction between the first direction and the second direction.

6. The memory module of claim 4, wherein:

the first wiring is in a shape of a straight line extending in a direction between the first direction and the second direction; and the second wiring is in a shape of a straight line extending in a direction between the first direction and the second direction and crossing an extending direction of the first wiring.

7. The memory module of claim 1, wherein:

the second memory chip is disposed on an axis different from an axis of the first memory chip in the second direction, and the fourth memory chip is disposed on an axis different from an axis of the third memory chip in the second direction.

8. The memory module of claim 1, wherein a length of the first wiring and a length of the second wiring are different from each other.

9. The memory module of claim 1, wherein the first wiring has a same length as a length of the second wiring.

10. The memory module of claim 1, wherein the signal line is a command/address signal line.

11. A memory module comprising:

a printed circuit board (PCB) comprising a multi-layer having a wiring structure formed therein, wherein a length of the PCB in a first direction is longer than a length of the PCB in a second direction perpendicular to the first direction; and a plurality of memory chips including a plurality of solder balls, the plurality of memory chips is arranged in a first row and a second row respectively extending in the first direction on the PCB, wherein a length of each of the plurality of memory chips in the first direction is longer than a length of each of the plurality of memory chips in the second direction, wherein the plurality of solder balls is arranged at regular intervals in the first direction, and is arranged at irregular intervals in the second direction, wherein a number of the plurality of solder balls arranged in the first direction is greater than a number of the plurality of solder balls arranged in the second direction, wherein the wiring structure alternately zigzag-connects the plurality of memory chips arranged in the first row and the second row inside the PCB, wherein each of the plurality of memory chips comprises a first area and a second area, wherein a first set of the plurality of solder balls are disposed in the first area and a second set of the plurality of solder balls are disposed in the second area, wherein the first set of the plurality of solder balls are electrically connected to the PCB and configured to provide a command/address signal, and wherein the second set of the plurality of solder balls are electrically connected to the PCB and configured to provide a data input/output signal.

12. The memory module of claim 11, wherein the wiring structure comprises:

a first wiring connecting the plurality of memory chips disposed in the first row and the second row, the first wiring having a shape of a straight line extending in a third direction;

a second wiring formed in a layer different than a layer that the first wiring is formed, the second wiring connecting the plurality of memory chips arranged in the first and second rows, wherein the second wiring has a shape of a straight line extending in a fourth direction different from the third direction; and a via electrically connecting the first wiring to the second wiring.

13. The memory module of claim 12, wherein:

the third direction is a same direction as the first direction; and the fourth direction is a direction between the first direction and the second direction.

14. The memory module of claim 12, wherein:

the third direction is a direction between the first direction and the second direction; and the fourth direction is a direction between the first direction and the second direction that crosses the third direction.

15. The memory module of claim 11, wherein the plurality of memory chips arranged in the second row is arranged in the second direction on a same axis as an axis of the plurality of memory chips arranged in the first row.

16. The memory module of claim 11, wherein the plurality of memory chips arranged in the second row is arranged in the second direction on an axis different from an axis of the plurality of memory chips arranged in the first row.

17. A memory system comprising:

a memory module comprising a printed circuit board (PCB), wherein a length of the PCB in a first direction is longer than a length of the PCB in a second direction perpendicular to the first direction, and a plurality of memory chips arranged in a first row and a second row respectively extending in the first direction on the PCB, wherein a length of each memory module in the first direction is longer than a length of each memory module in the second direction; and a memory controller transmitting a signal to the memory module, wherein the PCB comprises:

a first wiring connecting the plurality of memory chips arranged in the first row and the second row, the first wiring having a shape of a straight line extending in a third direction;

a second wiring formed in a layer different than a layer that the first wiring is formed, the second wiring connecting the plurality of memory chips arranged in the first row and the second row, wherein the second wiring has a shape of a straight line extending in a fourth direction that is a direction different from the third direction; and a via electrically connecting the first wiring and the second wiring, wherein each of the plurality of memory chips comprises:

a first area and a second area; and a plurality of solder balls arranged at regular intervals in the first direction and arranged at irregular intervals in the second direction, wherein a first set of the plurality of solder balls are disposed in the first area and a second set of the plurality of solder balls are disposed in the second area, wherein the first set of the plurality of solder balls are electrically connected to the PCB and configured to provide a command/address signal, and wherein the second set of the plurality of solder balls are electrically connected to the PCB and configured to provide a data input/output signal.

18. The memory system of claim 17, wherein:

the third direction is a same direction as the first direction; and the fourth direction is a direction between the first direction and the second direction.

19. The memory system of claim 17, wherein:

the third direction is a direction between the first direction and the second direction; and the fourth direction is a direction between the first direction and the second direction that crosses the third direction.

20. The memory system of claim 17, wherein the via is electrically connected to the first set of the plurality of solder balls in the first area.

* * * * *